US011289601B2

(12) United States Patent
Ionescu et al.

(10) Patent No.: US 11,289,601 B2
(45) Date of Patent: Mar. 29, 2022

(54) NEGATIVE CAPACITANCE SEMICONDUCTOR SENSOR

(71) Applicant: ECOLE POLYTECHNIQUE FEDERALE DE LAUSANNE (EPFL), Lausanne (CH)

(72) Inventors: Mihai Adrian Ionescu, Ecublens (CH); Francesco Bellando, Renens (CH); Ali Saeidi, Ecublens (CH)

(73) Assignee: ECOLE POLY TECHNIQUE FEDERALE DE LAUSANNE (EPFL), Lausanne (CH)

( * ) Notice: Subject to any disclaimer, the term of this patent is extended or adjusted under 35 U.S.C. 154(b) by 140 days.

(21) Appl. No.: 16/717,991

(22) Filed: Dec. 17, 2019

(65) Prior Publication Data
US 2020/0194592 A1 Jun. 18, 2020

(30) Foreign Application Priority Data
Dec. 18, 2018 (EP) ..................................... 18213348

(51) Int. Cl.
*H01L 29/78* (2006.01)
*G01N 27/414* (2006.01)
(Continued)

(52) U.S. Cl.
CPC ... *H01L 29/78391* (2014.09); *G01N 27/4145* (2013.01); *H01L 29/513* (2013.01); *H01L 29/6684* (2013.01); *H01L 29/66568* (2013.01)

(58) Field of Classification Search
CPC ............. H01L 29/78391; H01L 29/513; H01L 29/66568; H01L 29/6684; H01L 27/11502;
(Continued)

(56) References Cited

U.S. PATENT DOCUMENTS

2011/0147723 A1* 6/2011 Hodges, Jr. ......... H01L 51/0529
257/40
2014/0027314 A1* 1/2014 Park ................... G01N 27/4145
205/792
(Continued)

FOREIGN PATENT DOCUMENTS

CN 108231901 A * 1/2018
CN 108231901 A 6/2018
(Continued)

OTHER PUBLICATIONS

European Search Report and Opinion in application 18213348.8 dated Feb. 12, 2019.
Chen et al. "pH Sensing of Ba0.7Sr0.3TiO3/SiO2 Film for Metal-Oxide-Semiconductor and Ion-Sensitive Field-Effect Transistor Devices" Journal of the Electrochemical Society, 2009, vol. 156(6), pp. G59.
Buniatyan et al. "Capacitive field-effect pH sensor based on an electrolyte-ferroelectric-insulator-semiconductor structure" Event: SENSOR+TEST Conferences 2009.
(Continued)

*Primary Examiner* — Moin M Rahman
*Assistant Examiner* — Mohammad A Rahman
(74) *Attorney, Agent, or Firm* — Maschoff Brennan

(57) ABSTRACT

A semiconductor sensor includes a source element; a drain element; and a semiconductor channel element between the source element and the drain element, forming an electrically conductive channel. An insulator is positioned between the semiconductor channel element and a solution to be sensed. A reference contacts the solution and sets an electric potential of the solution. A bias voltage source generates an external sensor bias voltage for electrically biasing the reference electrode. A sensing surface interacts with the solution comprising analytes for generating a surface potential change at the sensing surface dependent on the concentration of analytes. The sensor further includes a ferroelectric capacitance element between the insulator and the bias voltage source for generating a negative capacitance for a differential gain between the external sensor bias voltage and an internal sensor bias voltage sensed at a surface of the
(Continued)

channel element facing the insulator or ferroelectric capacitance element.

20 Claims, 4 Drawing Sheets

(51) Int. Cl.
*H01L 29/66* (2006.01)
*H01L 29/51* (2006.01)

(58) Field of Classification Search
CPC .......... H01L 29/516; H01L 2924/1441; H01L 27/11585; H01L 29/40111; G01N 27/4145
See application file for complete search history.

(56) References Cited

U.S. PATENT DOCUMENTS

2018/0059051 A1* 3/2018 Yang .................. G01N 33/5438
2019/0094176 A1* 3/2019 Wang ................. G01N 33/1813

FOREIGN PATENT DOCUMENTS

DE     102014219633 A1   4/2016
EP          1512982 A2   3/2005

OTHER PUBLICATIONS

Fabiano et al. "Ferroelectric Polarization Induces Electric Double Layer Bistability in Electrolyte-Gated Field-Effect Transistors" ACS Applied Materials and Interfaces, (6), 1, 438-442. Nov. 19, 2013.

* cited by examiner

NEGATIVE CAPACITANCE SEMICONDUCTOR SENSOR

TECHNICAL FIELD

The present invention relates to a semiconductor sensor, such as an ion-sensitive field-effect transistor (ISFET), chemical field-effect transistor (Chem FET), field-effect transistor-based biosensor (BioFET), or their respective counterparts based on other kinds of semiconductor sensors, such as tunnel field-effect transistors (TFETs). More specifically, the proposed sensor exploits the negative capacitance effect of a ferroelectric material to improve its performance.

BACKGROUND OF THE INVENTION

The first type of field-effect transistor chemical sensor was first introduced by Bergveld in the early 70s. It provided a semiconductor alternative to the glass electrodes for pH and ion measurements. In its simplest form, a FET chemical sensor or an ISFET is comparable to a planar metal-oxide-semiconductor field-effect transistor (MOSFET) except that the gate electrode directly in contact with the gate dielectric is instead replaced by a reference electrode acting as a local gate immersed in a solution contacting the gate dielectric. Alternatively, a metal layer and/or a functionalisation layer may cover (fully or partially) the gate dielectric and be in contact with the solution. Ions or charged molecules or analytes, also referred to as biomarkers, in the solution generate a surface potential at the solution—gate dielectric interface. If this contribution is significant enough at the ISFET surface, it can modify the gate potential and contribute to the electrostatic control of the transistor channel thus affecting the drain to source current, also referred to simply as a drain current, to be sensed. In particular, adsorbed charged molecules produce a surface potential $\varphi_0$ on the gate oxide resulting in a threshold voltage $V_{th}$ change of the ISFET. For a fixed reference electrode potential $V_{Ref}$, the surface potential $\varphi_0$ changes only as a function of the concentration of the charged molecules. Traditionally $V_{Ref}$ is usually set to a fixed value to operate the transistor in subthreshold slope regime, which provides higher sensitivity. Sensing TFETs rely on the same sensing mechanism, but they employ a different current injection principle (band to band tunnelling instead of thermal injection).

Conventional ISFETs have a theoretical upper limit for their sensitivity. By sensitivity is here understood the relative variation of the drain current due to a relative variation of biomarker concentration in the solution being tested. This limit is given by the combination of the thermal limit, which prevents the relative variation of the drain current to be greater than one decade per each 60 mV of variation of the transistor gate bias voltage, and the Nernst limit, which prevents the variation of the gate bias voltage to be greater than 60 mV per each decade of variation of the biomarker concentration in the solution being tested, for an overall sensitivity limit of one decade of drain current variation per one decade of biomarker concentration variation in the solution. However, in some cases, even a proportionally small variation in the biomarker concentration can be relevant, but the sensitivity of conventional sensors may be insufficient to detect it, especially if the measurement conditions are not ideal and noise is added to the system, which is often the case when using e.g. wearable devices or point of care devices.

CN108231901 (A) provides a field effect transistor based on negative capacitance and a preparation method thereof, and a biosensor and a preparation method thereof. The preparation method of the field effect transistor comprises the steps of: providing a semiconductor substrate comprising underlying silicon, buried oxide and top silicon; defining a channel figure, and a source figure and a drain figure which are connected with two ends; performing ion implantation to positions corresponding to the source figure and the drain figure to form a channel region, a source region and a drain region; forming a dielectric layer at the surface of the channel region; forming a conductive layer at the surface of the dielectric layer, and forming a ferroelectricity material layer at the surface of the conductive layer; and making a source electrode, a drain electrode and a gate electrode. According to CN108231901 (A), a traditional field effect transistor is integrated with the ferroelectricity negative capacitance directly on the surface of the conductive layer to reduce the subthreshold amplitude of a device, improve the sensing sensitivity and the response speed and facilitate reduction of the device power.

Publication "pH Sensing of $Ba_{0.7}Sr_{0.3}TiO_3/SiO_2$ Film for Metal-Oxide-Semiconductor and Ion-Sensitive Field-Effect Transistor Devices" by Chun-Yuan Chen et al., Journal of the Electrochemical Society, vol. 156, no. 6, 3 Apr. 2009, page G59, XP055548191 discloses the use of $Ba_{0.7}Sr_{0.3}TiO_3/SiO_2$ film for metal-oxide-semiconductor and ion-sensitive field-effect transistor devices.

SUMMARY OF THE INVENTION

It is an object of the present invention to increase the performance of conventional semiconductor sensors and in particular their sensitivity.

According to a first aspect of the invention, there is provided a semiconductor sensor as recited in claim 1.

The proposed new solution has the advantage that the sensitivity of the semiconductor sensor can be increased compared with conventional semiconductor sensors, which do not exploit the benefits of negative capacitance. Furthermore, the proposed solution is very energy efficient (higher current efficiency with respect to standard semiconductor sensors) and can thus be used in low power applications.

In the present description, by a semiconductor may be understood a material or element that has an electrical conductivity value falling between that of a metal, such as copper, gold etc, and an insulator, such as glass. Their resistance decreases as their temperature increases. This kind of behaviour is opposite to that of a metal. Their conducting properties may be altered by the deliberate, controlled introduction of impurities ("doping") into their crystal structure.

According to a second aspect of the invention, there is provided a wearable device comprising the semiconductor sensor according to the first aspect of the present invention.

According to a third aspect of the invention, there is provided a method of sensing a given property of a solution by using the sensor according to the first aspect as recited in claim 13.

Other aspects of the invention are recited in the dependent claims attached hereto.

BRIEF DESCRIPTION OF THE DRAWINGS

Other features and advantages of the invention will become apparent from the following description of nonlimiting example embodiments, with reference to the appended drawings, in which.

DETAILED DESCRIPTION OF EMBODIMENTS OF THE INVENTION

Figure 1:
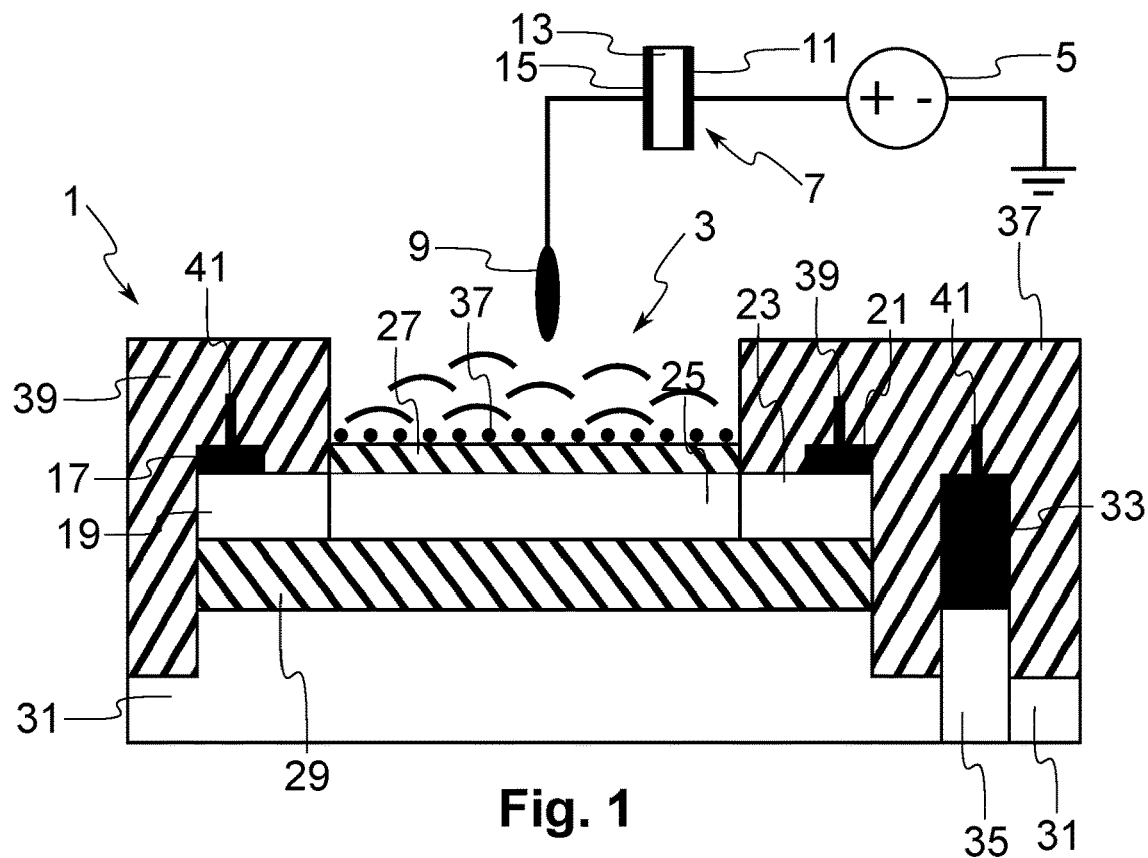
FIG. 1 is a simplified schematic view of a FET-based chemical sensor according to a first embodiment of the present invention.

Some embodiments of the present invention will now be described in detail with reference to the attached figures. Some of these embodiments are described in the context of a multi-gate ion-sensitive field-effect transistor, but the teachings of the invention are not limited to this environment. The teachings of the invention are equally applicable for instance in other biological or chemical (including biochemical) sensors, referred to as biosensors, operating as described below. Identical or corresponding functional and structural elements which appear in the different drawings are assigned the same reference numerals. As utilised herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend". Some example embodiments of the invention are described next in detail.

FIG. 1 is a schematic view of a multi-gate chemical sensor 1, also referred to as a device, comprising two physically independent or separate gates according to the first embodiment of the present invention. In the present description, by a multi-gate device is understood a device comprising at least two gate elements, nodes, terminals or regions. Thus, the device of FIG. 1 could comprise more than two gates. However, the teachings of the present invention are equally applicable to chemical sensors having only one gate element. The sensor 1 of FIG. 1 comprises a field-effect transistor (FET) exposed to a liquid solution 3. As can be seen in FIG. 1, the sensor comprises an external input bias source or node 5, which in this example is a voltage source. The external input bias source is configured to generate a periodic external sensor electrical bias function or signal. It is to be noted that the word "signal" is used in the present description in its broad sense and does not imply that any information would be coded in the signal. The generated signal may have the waveform of a sawtooth wave, a sine wave (sinusoid), a triangle wave etc. The external input bias source is connected through a ferroelectric element 7 to a first electrode 9, which in this example is a reference electrode. The reference electrode may be considered to be an electrically conductive element, optionally a substantially flat plate, such as a metal plate, in which a reversible chemical reaction can happen at the surface to maintain the interface potential with the liquid. This electrode is usually immersed in a chlorine-saturated solution in order to stabilise its potential for all pH values and to avoid dechlorination of the surface.

In the present embodiment, the ferroelectric element is a ferroelectric capacitance or capacitive element or more specifically a ferroelectric capacitor (Fe—C) comprising a second electrode 11, a third electrode 15 and a ferroelectric material 13 sandwiched between the second and third electrodes. By ferroelectricity is understood the ability of a substance to retain electric polarisation in the absence of external field bias. Thus, a ferroelectric capacitor can be made by placing a ferroelectric material between two conducting plates, referred to herein as electrodes. The reference electrode 9 is in contact with or at least partly submerged in the solution 3 and is thus in direct contact with the solution. It is to be noted that in the present description the notation "reference electrode" also covers any type of integrated miniaturised reference electrode or an integrated miniaturised quasi-reference electrode, as well as a simple metal electrode immersed in the solution. The external input bias source 5 is arranged to electrically bias the reference electrode and thereby to set an electric potential of the solution. Thus, the reference electrode 9 is used to bias the solution. The reference electrode and the solution together form a first gate element or gate of the sensor. Thus, the first gate element is a liquid gate. The first gate may be also called a front gate of the sensor 1.

A conductive channel, also known as a FET channel, can be formed between a source element, node, terminal or region and a drain element, node, terminal or region to allow current, referred to as drain current, to flow in the channel. The source element, referred to also as a source, in this example comprises a fourth electrode, referred to as a source electrode 17 or electrical contact in direct contact with a source doped region 19, while the drain element, referred to also as a drain, comprises a fifth electrode, referred to as a drain electrode 21 or electrical contact in direct contact with a drain doped region 23. These two doped regions are of the same type, namely either of n or p type. The conductive channel can be formed in a channel element 25 with adjustable conductivity between the source and drain doped regions in the present example. In this example, the channel element is a thin or ultra-thin silicon (Si) body (in this example with a thickness smaller than 50 nm). A first insulator 27 or a first dielectric layer is placed between the channel element 25 and the solution 3. The first insulator is in this example on the channel element. A second insulator 29 or a second dielectric, in this example a buried oxide layer or more specifically an ultra-thin buried oxide (UT-BOX) 29 (in this example with a thickness smaller than 50 nm) is placed below the channel element 25 and above a substrate 31, referred to also as a base silicon. Thus, the stack comprising the ultra-thin silicon layer 25, the UTBOX layer 29, and the base silicon layer 31 forms a silicon on insulator (SOI) substrate.

The transistor also comprises a second gate element, referred to as a back gate, comprising a sixth electrode, referred to as a back gate electrode 33 or electrical contact, and a back gate doped region 35 in direct contact with the back gate electrode 33. The substrate 31 may be also considered to be part of the back gate. Consequently, in this example, the chemical sensor 1 is a dual-gate ISFET sensor manufactured on an ultra-thin buried oxide and body (UTBB) SOI substrate. In the present description, the electrodes or electrical contacts are metal conductors, but they could instead be any conductive elements, such as conductive polysilicon contacts. FIG. 1 also shows an optional functionalisation layer 37 deposited on top of the first insulator 27. In this example, the functionalisation layer 37 is arranged to be in contact with the solution (a fluid) 3 with a given analyte or biological component or chemical constituent (including for example ions or charged atoms or molecules) concentration. The functionalisation layer 37, also known as a sensor or probe material layer, may be used for selective detection of the properties of the analytes of interest. It is to be noted that in this example the front gate and the back gate are physically independent of each other.

A third insulator 39, also referred to as a housing insulator, is provided on the outside of the transistor and comprises for example insulating trenches or spacers to the left of the source doped region 19 and UTBOX 29 on the one hand, and surrounding the back gate contact 33 on the other hand. The trenches may be made of silicon dioxide and are used for instance to isolate the sensor from neighbouring sensors. The housing insulator 39 may also comprise on top of the trenches, which in this example reach the top surface of the back gate contact 33, a top insulating layer, which may be fabricated at a different fabrication stage than the trenches. All the three doped regions 19, 23, 35, the channel element 25 and the substrate 31 are in this example of silicon with possibly different doping levels. In FIG. 1, there are further shown biasing electrical interconnectors or vias 41, which may be used to bias the respective source, drain and gate contacts.

Thus, valid for all the embodiments in the present description, the back gate stack may be defined to comprise at least the back gate contact 33, the back gate doped region 35, the base substrate 31 and the second insulator 29. The front gate stack may be defined to comprise at least the liquid 3, the reference electrode 9 and the first insulator 27. Depending on the sensor configuration, the optional functionalisation layer may fully or partially cover the first insulator 27 and would thus be part of the front gate stack.

In the above described configuration, the FET channel is fully or substantially fully depleted (no intrinsic charge carriers) at all times (constantly) to enable strong electrostatic coupling between the surface potentials at the two gate insulator—semiconductor interfaces. More specifically, a first gate insulator—semiconductor interface (top interface) is the interface between the first dielectric layer 27 and the channel element 25, while a second gate insulator—semiconductor interface (bottom interface) is the interface between the channel element 25 and the ultra-thin buried oxide (UTBOX) layer 29. The FET channel is fully depleted and the surface potential at the front gate insulator—channel semiconductor interface and the surface potential at the back gate insulator—channel semiconductor interface are electrostatically coupled. The analytes in the solution generate a (different) surface potential at a sensing surface, which is the surface of the transistor exposed to the solution, which influences the surface potential at the gate insulator—channel semiconductor interface. The sensing surface is thus part of a sensing element, which in the first embodiment is the first insulator 27 or the functionalisation layer 37 (or both) if that is used. A fully depleted channel element thus increases the channel element conversion sensitivity when a surface potential change is detected at the surface of the sensing element. In other words, a surface potential change at the sensing surface efficiently modifies the electrical conductivity of the channel. Having a fully depleted channel also makes it easier to determine the capacitance value of the transistor, which is used for capacitance matching as explained later. However, it is to be noted that the teachings of the present invention also apply to sensors having only a partially depleted channel and to sensors not made on SOI.

The at least two independent gates in such a sensor can be exploited for two different functions. In the example of FIG. 1, the front gate is electrically biased to set a given operational regime of the transistor 1 (for a given source and drain biasing) with a given electrical conductivity of the channel between the source and drain. Examples of different operational regimes or operating points of the device are: strong inversion region, moderate inversion region, weak inversion (i.e. subthreshold) region, depletion region, weak accumulation region, moderate accumulation region, strong accumulation region, linear region or saturation region. The preferred regime is usually, but not always, the subthreshold region. In the present example, the back gate electrode is at a constant electric potential. The front gate is arranged to be in contact with the solution such that analytes in the solution may interact with the sensing surface, which in this example is a surface of the first insulator 27 or the functionalisation layer, and in turn generate a surface potential change that is dependent on the concentration of the analytes in the solution. In this example, the sensing surface is between the semiconductor channel element 25 and the solution 3. Thus, the front gate is also biased by the solution to be sensed. In this manner, the electrical conduction of the FET channel initially only set by the reference electrode biasing can be modified. The device 1 can therefore be used as a chemical sensor.

In the above sensing device 1, the FET sensor transduction surface, where the chemical information is converted into an electrical signal, i.e. surface potential, is part of the FET gate or gate stack. In other words, the transduction surface is part of the FET. In the configuration of FIG. 1, the transduction surface corresponds to the first insulator contact surface facing the functionalisation layer 37 or the solution 3. Alternatively, the transduction surface may not be part of the FET. In this case, the transduction surface may be spatially separated from the transistor but connected to it. In this scenario, the FET may be manufactured in the front-end-of-line (FEOL) fabrication process, while the sensor transduction surface may be fabricated in the back-end-of-line (BEOL) fabrication process.

Figure 2:
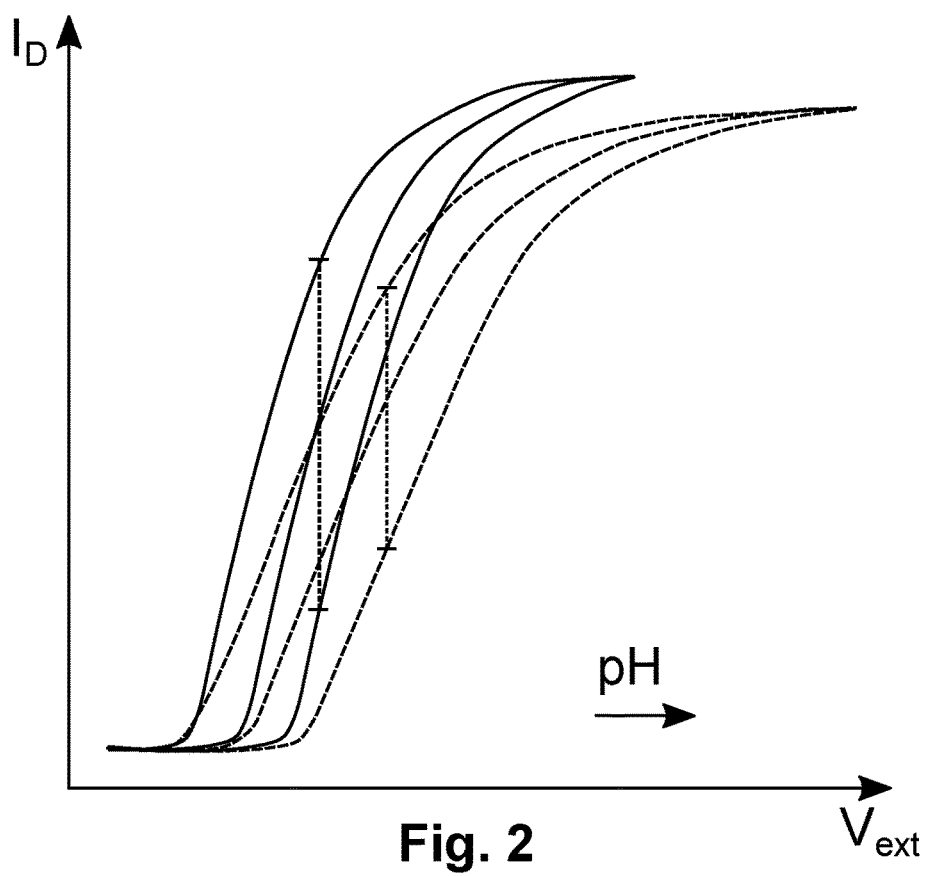
FIG. 2 is a graph showing drain current dependence on an applied external bias voltage in the sensor of FIG. 1 (continuous line) when compared to a conventional sensor (dashed line)

According to the embodiments explained herein, the sensors 1 exploit the negative capacitance (NC) effect to improve their biomarker detection or sensing sensitivity and consequently to increase the signal-to-noise ratio of any measured data. The sensors according to the present embodiments comprise a ferroelectric element 7, where the ferroelectric material may comprise one or more of the following materials: lead zirconate titanate $PbZr_{1-x}Ti_xO_3$ (PZT), polyvinylidene fluoride or polyvinylidene difluoride (PVDF), barium titanate ($BaTiO_3$), hafnium zirconium oxide HfZrO2 (HZO), Si-doped hafnium oxide (Si:HfO2) and Al-doped hafnium oxide Al:HfO2. The differential negative capacitance gain may, in the configuration of FIG. 1, be defined as the ratio between the variation of the bias applied to the reference electrode and the variation of bias applied to the ferroelectric capacitor ($dV_{int}/dV_{ext}$). The differential gain shows a peak in the "gain"/"external input voltage" graph, which also shifts with pH, and can therefore be used for evaluating the ion concentration in the solution. It is to be noted that the differential gain may more broadly be defined as the ratio between the variation of the output bias or voltage of the ferroelectric element and the variation of the input bias or voltage of the ferroelectric element. The internal sensor bias is the voltage that actually influences the current in the channel element. According to the teachings of the present invention, the negative capacitance may also be exploited to increase the drain current variation for a given variation of the gate sensor bias voltage. FIG. 2 shows the drain current $I_D$ dependence upon the external sensor input voltage $V_{ext}$, where the solid curves indicate the drain current for a sensor exploiting the negative capacitance, while the dashed curves indicate the drain current for conventional sensors without the benefit of the negative capacitance. It can be noticed that the negative capacitance makes the drain current curve steeper compared to conventional sensors. The graph also shows how the drain current curves are shifted with the increasing pH of the solution.

Figure 3:
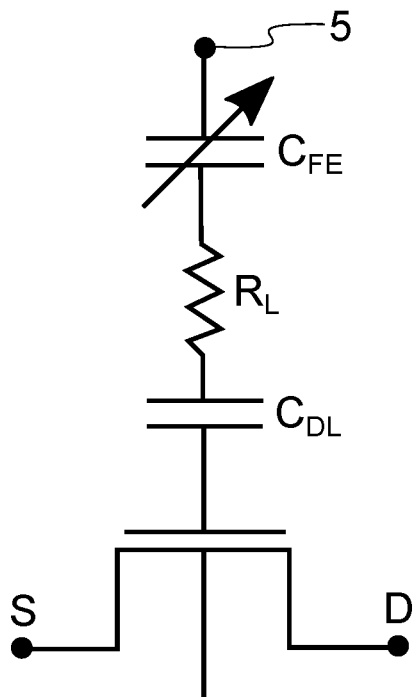
FIG. 3 is a circuit diagram illustrating the FET-based chemical sensor according to the first embodiment of the present invention.

As is shown in FIG. 1, the ferroelectric element, which in this example is a stand-alone ferroelectric capacitor, is inserted in series between the external input bias source 5 (which is the bias source for the reference electrode 7) and the reference electrode itself. In other words, the external bias source 5 for the reference electrode is connected to one of the contacts 11 of the Fe—C 7, while the other Fe—C contact 15 is connected to the reference electrode 9. This configuration allows applying the NC gain to the entire solution 3, which in turn allows employing a single Fe—C for a full set of independently functionalised ISFETs. In other words, the configuration of this embodiment allows transferring the voltage gain given by the Fe—C to the solution 3 enabling the use of a single Fe—C for multiple transistors optionally with individual functionalisation. FIG. 3 illustrates a simplified circuit diagram of the sensor 1. In FIG. 3, the following abbreviations are used: $C_{FE}$ denotes the capacitance of the ferroelectric element, $R_L$ denotes the resistance of the solution or liquid 3, $C_{DL}$ denotes the double-layer capacitance covering Stern and diffuse capacitances of the sensor 1, and S, D and BG denote the source node, drain node and back gate node, respectively. It is to be noted that an electrical double layer (DL) is a structure that appears on the surface of an object when it is exposed to a fluid. The DL refers to two substantially parallel layers of charge surrounding the object. The first layer, also called a Stern layer, consists of ions adsorbed onto the object due to chemical interactions. The second layer, also called a diffuse layer, is composed of ions attracted to the surface charge via the Coulomb force, electrically screening the first layer. The second layer is only loosely associated with the object. It consists of free ions that move in the fluid under the influence of electric attraction and thermal motion rather than being firmly anchored.

Figure 5:
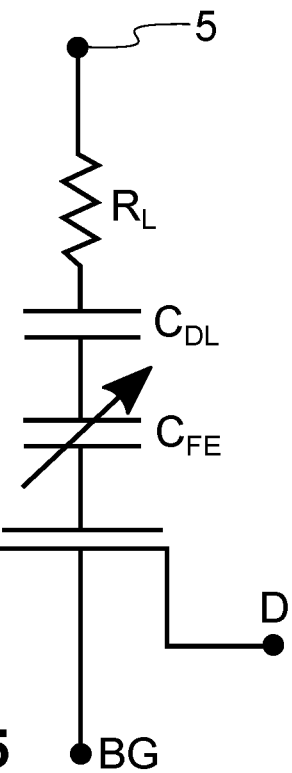
FIG. 5 is a circuit diagram illustrating the FET-based chemical sensor according to the second embodiment of the present invention.
Figure 4:
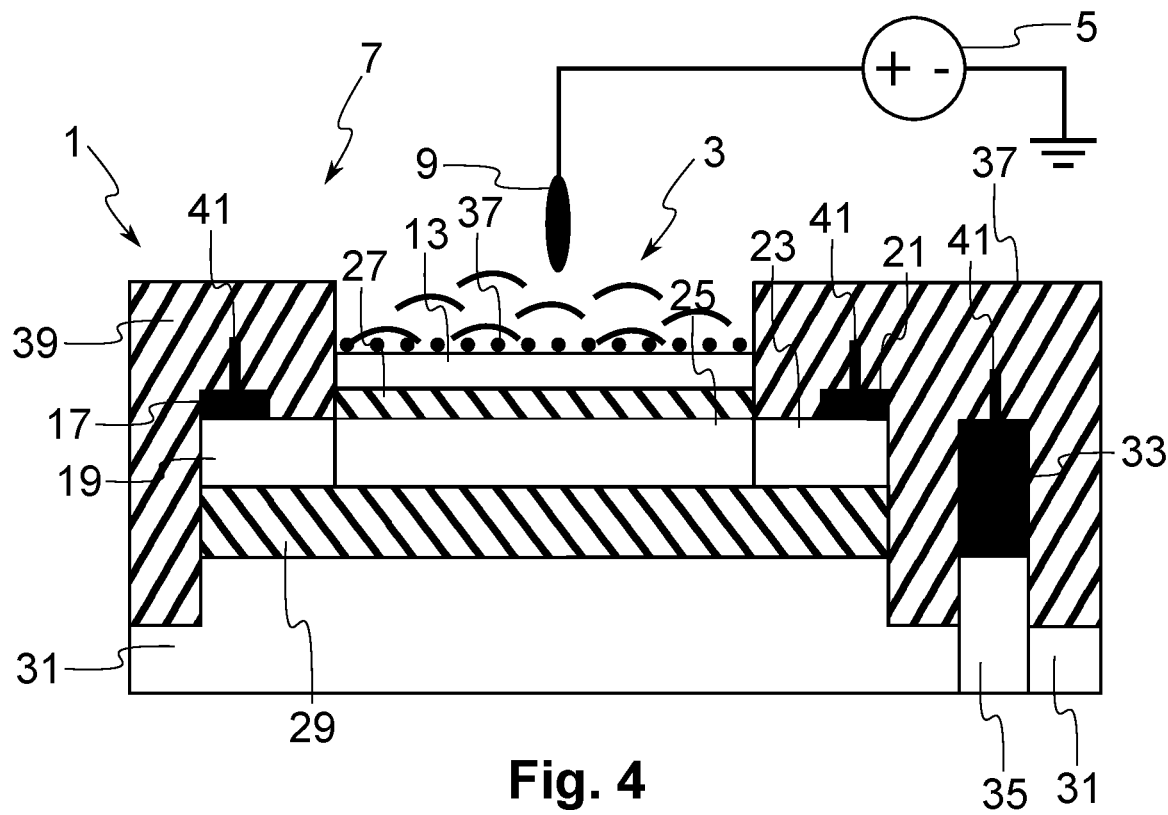
FIG. 4 is a simplified schematic view of a FET-based chemical sensor according to a second embodiment of the present invention.

FIG. 4 illustrates the second embodiment of the present invention. According to this embodiment, the ferroelectric material 13 is directly deposited on the gate oxide (i.e. the first insulator 27) of the transistor, thereby creating autonomous steep-slope devices which can be used for sensing. In other words, according to this embodiment, the ferroelectric material 13 is fabricated directly on top of the sensing gate of the sensors thus achieving the maximum possible level of system integration. This means that a standard reference electrode configuration can be used together with a non-standard transistor. The top layer of the ferroelectric material can be covered with an electrically conductive (e.g. a metal) layer and/or be functionalised for specific ion measurements or detection. FIG. 4 shows the configuration where no conductive layers are present but merely an optional functionalisation layer is deposited on the surface of the ferroelectric material 13. It is to be noted that in the absence of any conductive layers, the solution 3, the ferroelectric material 13, the first insulator 27, the conductive channel 25 and the UTBOX 29 would together form the Fe—C or more specifically a hybrid Fe—C, where the ferroelectric material 13 would be the only ferroelectrically active element while the other listed elements would be ferroelectrically passive elements. FIG. 5 illustrates a simplified circuit diagram of the sensor 1 according to the second embodiment.

Figure 6:
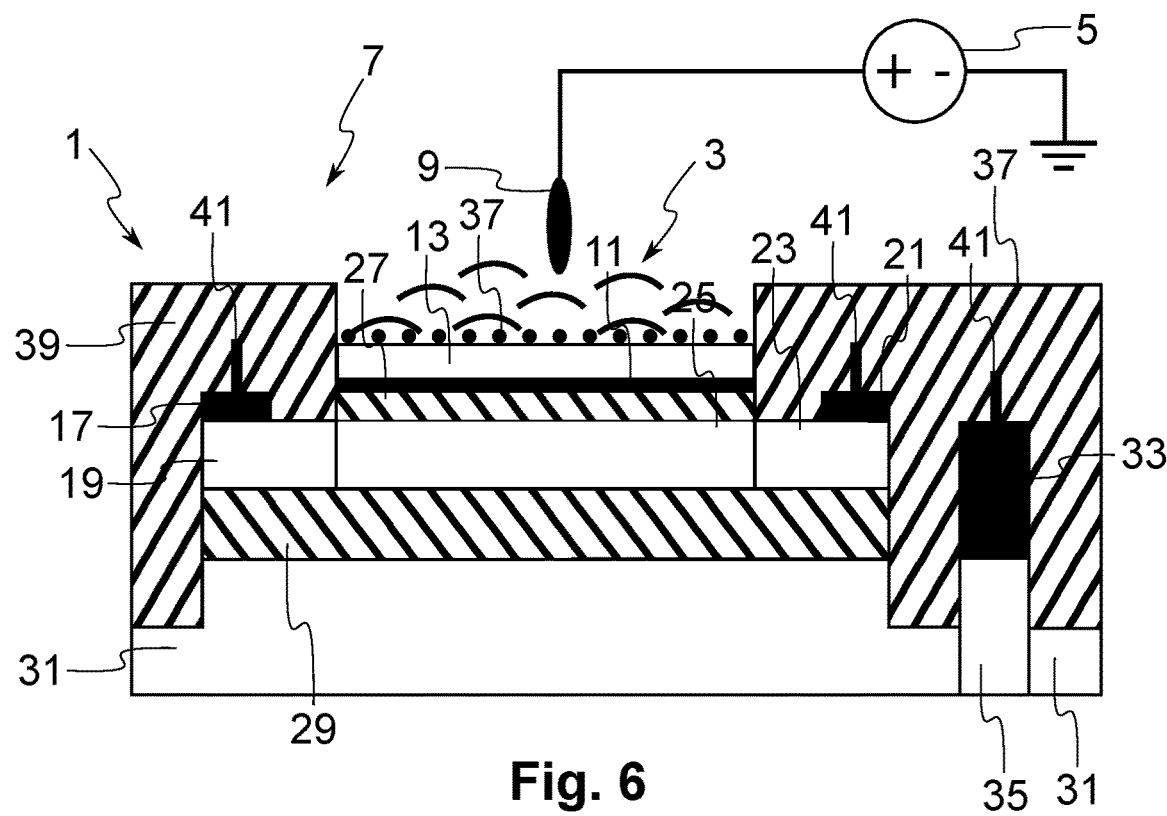
FIG. 6 is a simplified schematic view of a FET-based chemical sensor according to a third embodiment of the present invention.

FIG. 6 illustrates the third embodiment of the present invention. According to this embodiment, the ferroelectric element 7 is built on top of the gate oxide of the transistor as according to the second embodiment and for the same purpose, however, with the difference that a layer of metal 11 or other conductive material is interposed between the gate oxide 27 and the ferroelectric material 13 in order to guarantee a uniform bias on the gate dielectric (i.e. the first insulator 27). It would also be possible to insert an electrically conductive layer on top of the ferroelectric material 13 and to make it the sensing surface. In this case, a stand-alone ferroelectric capacitor 7 would in fact be deposited on the surface of the first insulator 27.

Figure 7:
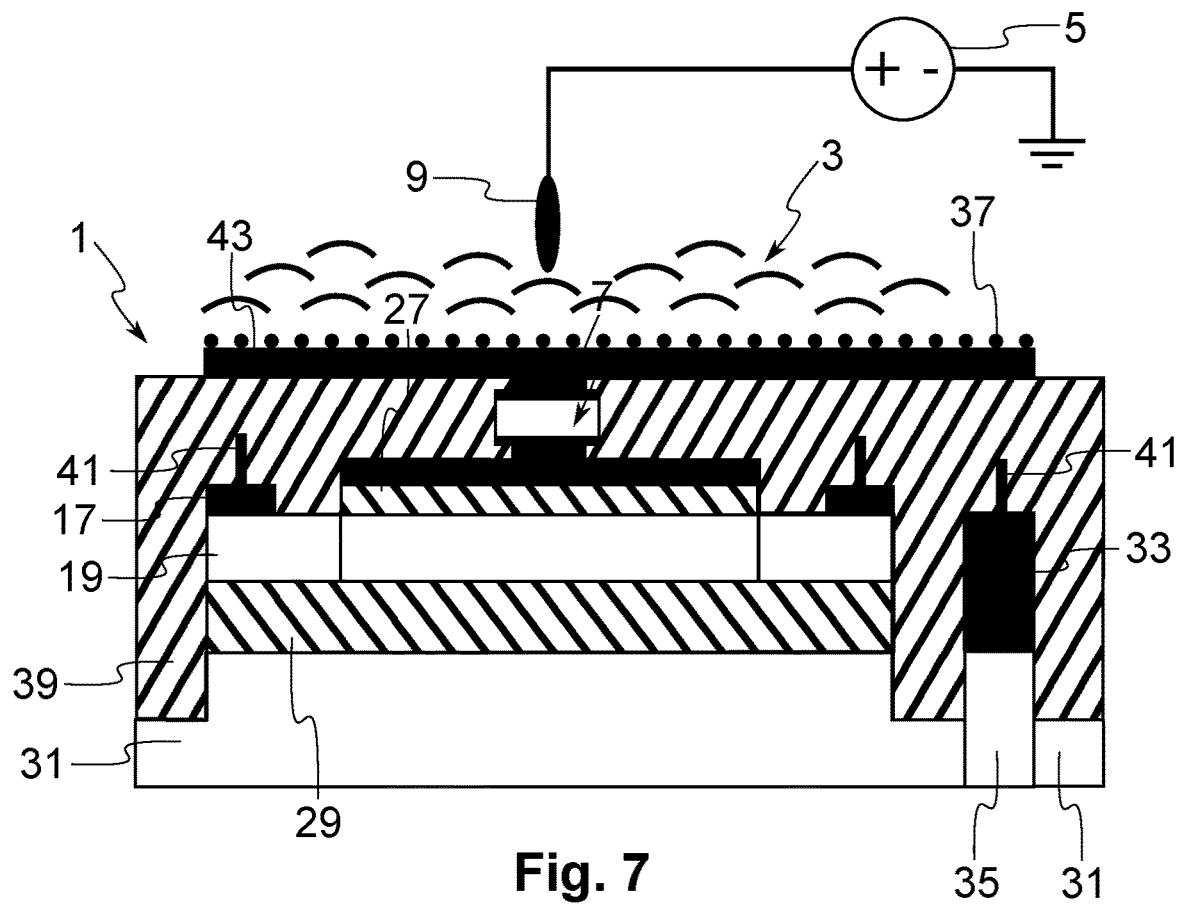
FIG. 7 is a simplified schematic view of a FET-based chemical sensor according to a fourth embodiment of the present invention.

FIG. 7 illustrates the fourth embodiment of the present invention. According to this embodiment, the transistor has an extended gate configuration, where the Fe—C 7 is interposed between the gate oxide (i.e. the first insulator 27) of the transistor and the area or surface exposed to the solution 3. The Fe—C can be positioned on top of the gate oxide, at the other end of the extended gate or in any position between these two extremes. In this example and as is shown in FIG. 7, the front gate comprises an electrically conductive element 43 deposited on top of the first insulator 27, which then extends upwards to form an extended gate configuration. This electrically conductive element is interrupted by the Fe—C 7 as is shown in FIG. 7. Thus, according to this embodiment, there is a through hole in the third insulator 39 for the front gate contact 43 to pass through it to reach the top surface of the first dielectric layer 27. The front gate metal contact forms a substantially flat longitudinal contact on the outside of the transistor and below the optional functionalisation layer 37.

Figure 8:
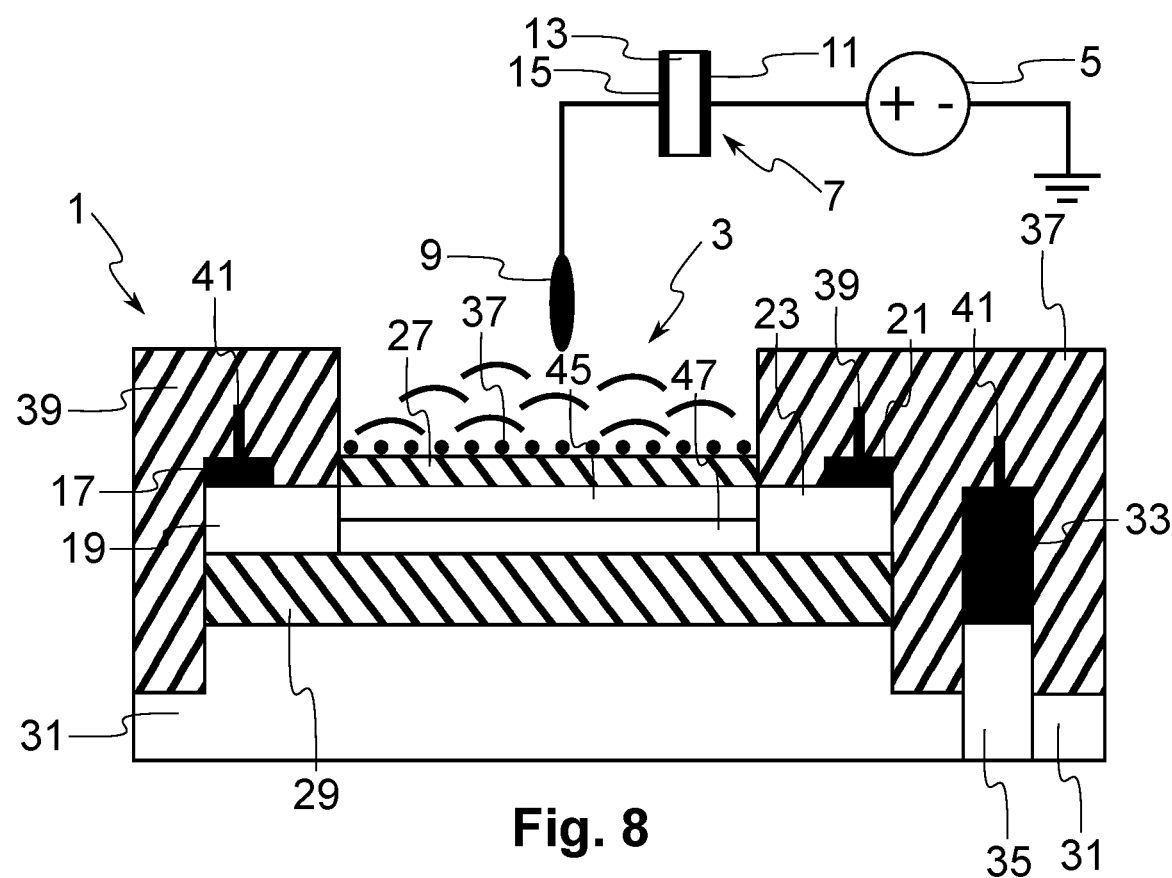
FIG. 8 is a simplified schematic view of a vertical heterojunction TFET sensor according to a fifth embodiment of the present invention.

FIG. 8 illustrates the fifth embodiment of the present invention. The fifth embodiment differs from the first embodiment in that the sensor according to the fifth embodiment is a TFET, and more specifically a vertical heterojunction TFET. The structure of the sensor is similar to the sensor structure according to the first embodiment, but the main difference is that the source and drain elements 19, 23 are not made of the same semiconductor and the channel 25 is made of a stack comprising at least two different semiconductor elements forming a first sub-channel element 45 and a second sub-channel element 47, which are vertically stacked in the example of FIG. 8. In this example, the semiconductor of the first sub-channel element 45 forms the source element, while the semiconductor of the second sub-channel element 47 forms the drain element, or vice versa. In this structure, the gate bias influences the drain current by modifying the band alignment at the junction between the two different semiconductor materials: the current is allowed to flow when the valence band energy of one of the semiconductors reaches or surpasses the conduction band energy of the other, so that the electrons can jump from one semiconductor to the other by tunnel effect. It is to be noted that other TFET structures are also possible.

As was explained above, the ferroelectric element 7 is placed in series with one or more contacts of a conventional ISFET. The ferroelectric element can either be fabricated on the same substrate as the ISFET or it can be fabricated on a separate substrate and then added to the biasing circuit. According to the second embodiment, the ferroelectric element is built directly on top of the gate dielectric (if it is left uncovered), while according to the third embodiment, the ferroelectric element is built on top of a gate metal (if a layer of metal is deposited prior to the fabrication of the ferroelectric element), leaving the top face of the ferroelectric element in contact with the solution 3 (and making it the sensing surface). According to the fourth embodiment, the ferroelectric element 7 is connected with a metal connection to one or more ISFET gates in an extended-gate configuration, potentially using the same ferroelectric element for multiple sensors.

In order to enable the switching mechanism to switch the polarisation of the ferroelectric material 13 from one polarisation state to another, which provides the negative capacitance differential gain, measurements of the drain current are taken by applying a periodic gate bias signal, such as a sawtooth shaped function, with a readout circuit or measurement unit (not illustrated) extracting the drain current value at a fixed bias point typically once per bias signal cycle. In other words, the drain current is measured at a given bias signal cycle location. This location thus remains the same at least for a given number of bias signal cycles. It is possible to take only one measurement, but for example, if the solution needs to be monitored continuously, then continuous measurements are taken at fixed signal cycle locations. Thus, at these locations, the bias voltage value remains substantially constant for each measurement. Depending on the bias signal shape, it may be possible to take measurements also twice per signal cycle as long as the hysteresis of the sensor is low enough to allow that.

Alternatively, instead of measuring the drain current, it is possible to measure the peak shift of the NC gain for measuring the ion concentration in the solution being tested. In this manner the pH value of the liquid can be measured. The NC gain peak shift measurements may also be used for measuring other properties of the solution. In the NC gain phase shift measurements, the X-axis represents the external sensor bias voltage, while the Y-axis represents the differential gain or NC gain $dV_{int}/dV_{ext}$.

As explained above, a ferroelectric capacitor in series with a dielectric (DE) capacitor of a proper value can be biased in the negative capacitance region, providing a larger capacitance than a conventional DE capacitor alone. In order to have a non-hysteretic NCFET, the ferroelectric NC and DE capacitors are advantageously well matched to provide a positive total capacitance in the whole range of the operation. Thus, to optimally benefit from the negative capacitance effect of the ferroelectric element, the negative capacitance is matched with a stabilising capacitance of the sensor such that an overall capacitance consisting of the negative capacitance and the stabilising capacitance is positive. The stabilising capacitance comprises the following capacitances of the sensor: the diffuse capacitance $C_{diffuse}$, the Stern capacitance $C_{Stern}$, the sensor parasitic capacitance $C_p$, and the capacitance relating to the FET $C_{FET}$ (including e.g. the gate capacitance, depletion capacitance and/or BOX capacitance). In practice, the stabilising capacitance value is determined first and then the ferroelectric capacitor 7 is designed accordingly.

The above-described semiconductor sensors may be used in various applications, such as in wearable sensors or lab-on-a-chip devices, which integrate one or several laboratory functions on a single integrated circuit, or portable sensing devices, which may analyse biomarkers in sweat for example. The detected data may then be transferred to a data processing device, such as a smartphone, for further processing and/or for showing the data to a user. The sensor 1 itself may be very small, for example the largest dimension may be less than one cm. Furthermore, in the present description, a thin or ultra-thin element is understood to have a cross-sectional thickness of less than 100 nm, and possibly even less than 50 nm or even less than 10 nm. In the figures, the thickness of an element is thus understood to be the distance between a top surface and a bottom surface.

While the invention has been illustrated and described in detail in the drawings and foregoing description, such illustration and description are to be considered illustrative or exemplary and not restrictive, the invention being not limited to the disclosed embodiments. Other embodiments and variants are understood, and can be achieved by those skilled in the art when carrying out the claimed invention, based on a study of the drawings, the disclosure and the appended claims. For example, it is possible to combine teachings of any of the embodiments to obtain further embodiment or variants. For example, it would be possible to place the ferroelectric element 7 between the channel element 25 and the first insulator 27. Furthermore, the invention also relates to a method operating the chemical sensor for sensing a solution as described above.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A semiconductor sensor comprising:
   a source element;
   a drain element;
   a semiconductor channel element between the source element and the drain element for forming an electrically conductive channel;
   a first insulator between the semiconductor channel element and a solution to be sensed;
   a reference electrode configured to be in contact with the solution, the reference electrode being configured to set an electric potential of the solution;
   a bias voltage source for generating an external sensor bias voltage for electrically biasing the reference electrode; and
   a sensing surface for interacting with the solution comprising analytes for generating a surface potential change at the sensing surface dependent upon the concentration of the analytes in the solution,
   wherein the semiconductor sensor comprises a ferroelectric capacitance element for generating a negative capacitance for providing a differential gain between the external sensor bias voltage and an internal sensor bias voltage sensed at a surface of the channel element facing the first insulator, and wherein the ferroelectric capacitance element is placed between the bias voltage source and the reference electrode such that the bias voltage is connected through the ferroelectric capacitance element to the reference electrode, and such that the bias voltage source, the ferroelectric capacitance element, and the reference electrode are in a series configuration.

2. The sensor according to claim 1, wherein the negative capacitance is matched with a stabilising capacitance of the sensor such that an overall capacitance of the sensor consisting of the negative capacitance and the stabilising capacitance is positive.

3. The sensor according to claim 1, wherein the external sensor bias voltage is a periodic signal.

4. The sensor according to claim 3, wherein the periodic signal has one of the following waveform shapes: sawtooth, sine and triangle.

5. The sensor according to claim 3, wherein the sensor further comprises a measurement unit arranged to measure electric current in the channel element at given periodic time intervals such that the value of the external sensor bias voltage is substantially constant for different current measurements.

6. The sensor according to claim 1, wherein the sensor further comprises a measurement unit arranged to measure a peak shift of the differential gain along an axis representing the external sensor bias voltage for measuring an analyte concentration in the solution.

7. The sensor according to claim 1, wherein the sensor is one of the following: an ion-sensitive field-effect transistor, a chemical field-effect transistor, field-effect transistor-based biosensor and a tunnel field-effect transistor.

8. The sensor according to claim 1, wherein the sensor comprises an electrically conductive layer between the ferroelectric capacitance element and the first insulator.

9. The sensor according to claim 1, wherein the sensor comprises an extended gate configuration such that an electrically conductive layer is provided on the outside of the sensor and faces the solution, the electrically conductive layer being conductively connected to the first insulator.

10. The sensor according to claim 1, wherein the thickness of the channel element is less than 100 nm and/or the channel element is fully depleted.

11. The sensor according to claim 1, wherein the sensor further comprises a base substrate and a buried oxide layer, which is between the base substrate and the channel element.

12. A method of sensing a given property of a solution by using the semiconductor sensor according to claim 1, the method comprising:
applying a periodic external sensor bias voltage to the reference electrode for electrically biasing the reference electrode; and measuring electric current in the channel element at given periodic time intervals such that the value of the external sensor bias voltage is substantially constant for different measurements; and/or
measuring a peak shift of the differential gain along an axis representing the external sensor bias voltage for measuring an analyte concentration in the solution.

13. A wearable device comprising the sensor according to claim 1.

14. A wearable device comprising the sensor according to claim 2.

15. A wearable device comprising the sensor according to claim 3.

16. A wearable device comprising the sensor according to claim 4.

17. A wearable device comprising the sensor according to claim 5.

18. A wearable device comprising the sensor according to claim 6.

19. A wearable device comprising the sensor according to claim 7.

20. A wearable device comprising the sensor according to claim 8.

* * * * *